United States Patent
Guldi et al.

(10) Patent No.: US 6,420,792 B1
(45) Date of Patent: Jul. 16, 2002

(54) SEMICONDUCTOR WAFER EDGE MARKING

(75) Inventors: Richard L. Guldi, Dallas; Keith W. Melcher, McKinney; John Williston, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/661,963

(22) Filed: Sep. 14, 2000

Related U.S. Application Data

(60) Provisional application No. 60/155,995, filed on Sep. 24, 1999.

(51) Int. Cl.$^7$ ................... H01L 21/76; G01N 21/86; B23K 26/38
(52) U.S. Cl. ............... 257/797; 257/620; 257/627; 257/347; 438/959; 438/401; 438/462; 145/33.2; 219/121.69; 219/121.68
(58) Field of Search ................. 257/797, 620, 257/723, 685, 686, 623, 347, 627; 438/959, 692, 906, 462, 149, 479, 517, 113, 458, 401, 975; 148/33.2; 414/936; 219/121.69, 121.68

(56) References Cited

U.S. PATENT DOCUMENTS

| | | | | |
|---|---|---|---|---|
| 5,800,906 A | * | 9/1998 | Lee et al. | 428/192 |
| 6,004,405 A | * | 12/1999 | Oishi et al. | 257/620 |
| 6,037,259 A | * | 3/2000 | Lin et al. | 438/692 |
| 6,051,845 A | * | 4/2000 | Uritsky | 250/559.3 |
| 6,112,738 A | * | 9/2000 | Witte et al. | 125/16.02 |
| 6,303,899 B1 | * | 10/2001 | Johnson et al. | 438/462 |
| 2001/0019078 A1 | * | 9/2001 | Ackley | 235/462.01 |
| 2001/0038153 A1 | * | 11/2001 | Sakaguchi | 257/797 |

FOREIGN PATENT DOCUMENTS

| | | | | |
|---|---|---|---|---|
| JP | 60-45011 | * | 3/1985 | 438/17 |
| JP | 60-217624 | * | 10/1985 | 29/25.01 |
| JP | 5-13388 | * | 1/1993 | 438/464 |
| JP | 11-329915 | * | 11/1999 | |

* cited by examiner

*Primary Examiner*—Alexander O. Williams
(74) *Attorney, Agent, or Firm*—Lawrence J. Bassuk; W. James Brady; Frederick J. Telecky, Jr.

(57) ABSTRACT

The marking of identification and orientation information along the edge (E) of a semiconductor wafer (20, 20') is disclosed. The information may be marked by way of laser marking at one or more locations (10) along a flat portion (14) or bevel (12$_t$, 12$_b$) of the edge (E) of the wafer (20, 20'). The wafer marking (10) may be encoded, for example by way of a 2-D bar code. A system (30) for reading the identification information from wafers (20, 20') in a carrier (32) is also disclosed. The system (30) includes a sensor (36) for sensing reflected light from the wafer markings (10) along the wafer edge (E), and for decoding identification and orientation therefrom. A motor (38), under the control of feedback (RFB) from the sensor (36), rotates the wafers (20, 20') by way of a roller (39) until the wafer marking (10) is in view by the sensor (36). A processing system (40), which includes a rotatable chuck (41) upon which the wafer (20, 20') is placed, is also disclosed. The processing system (40) also includes a sensor (36) for sensing identification and orientation information from the wafer edge (E), and a process control computer (46) that receive signals corresponding to the identification information, for purposes of manufacturing data logging and process control.

19 Claims, 4 Drawing Sheets

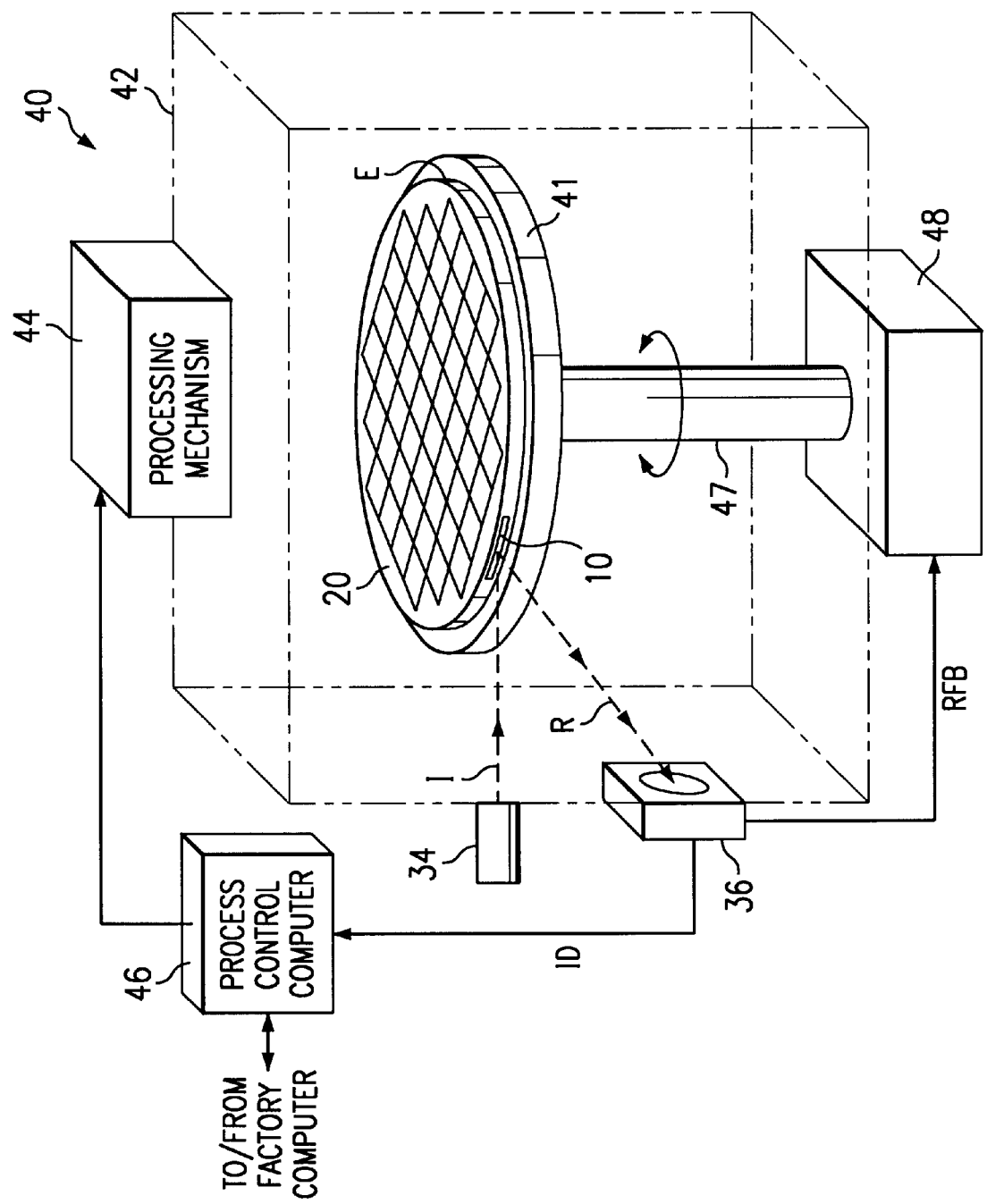

SEMICONDUCTOR WAFER EDGE MARKING

CROSS-REFERENCE TO RELATED APPLICATIONS

This application claims benefit of Prov. No. 60/155,995 filed Sep. 24, 1999.

STATEMENT REGARDING FEDERALLY SPONSORED RESEARCH OR DEVELOPMENT

Not applicable.

BACKGROUND OF THE INVENTION

This invention is in the field of integrated circuit manufacture, and is more specifically directed to the identification and orientation of semiconductor wafers throughout the manufacturing process.

As is fundamental in the art, modern semiconductor integrated circuits are fabricated at the surface of a wafer of semiconductor material such as single-crystal silicon. Each circuit, which is referred to as a "die" when in chip form, is at a position within an array of die at the wafer surface, so as to be fabricated simultaneously with the other die on that wafer. Since some manufacturing processes, such as thermal oxide growth, cleanups, and the like are performed simultaneously for multiple wafers, the wafers are also generally grouped into lots during the manufacturing processes. Other processes, such as photolithography, plasma etch, and the like are generally performed on a wafer-by-wafer basis.

Because all of the die on a given wafer are processed substantially identically relative to one another, many of their electrical characteristics will be substantially similar. Similarly, to the extent that the wafers in a lot are fabricated by batch processes, some of the electrical characteristics of the integrated circuits on different wafers within the same lot will also be quite similar. Additionally, most wafer fabrication factories maintain data regarding the date, time, manufacturing operators, and processing parameters (temperatures, times, gases and liquids used, process equipment used, etc.) according to which each wafer and each lot are manufactured. It is therefore useful to identify each lot, and each wafer within the lot, during the manufacture and electrical testing of the integrated circuits, so that electrical and manufacturing yield, as well as electrical performance of the eventual integrated circuits, may be correlated to this process information. Additionally, the identification of wafers within lots has now permitted the order of wafers within the lot to be randomized at certain manufacturing processes, facilitating the analysis of the dependence of integrated circuit yield and performance upon process parameters.

It has therefore become commonplace in the manufacture of integrated circuits to mark wafers with some type of identifier, generally a lot identifier and a wafer identifier. These identifiers are conventionally marked on the front surface of the wafer (i.e., the wafer surface at which the integrated circuits are being formed). A typical method of marking the lot identifier on a semiconductor wafer is by laser marking, where the laser locally melts the semiconductor in a pattern corresponding to the lot number and wafer number; recrystallization of the locally melted semiconductor then provides a permanent identifier upon the wafer surface.

The particular format of the lot and wafer identifiers can vary widely, depending primarily upon the manner in which the identifiers are to be read. In years past, the lot and wafer numbers were simply marked as human readable numerals, visible to the naked eye. Recently, various coded formats have been used so that the lot and wafer identifiers are machine readable. For example, the BC412 bar code symbology, which utilizes a linear or "1-D" bar code, has recently become accepted as a standard for wafer marking by SEMI.

Additionally, the manufacturer of the semiconductor wafers that are to be used in the manufacture of integrated circuits (i.e., the starting material for the wafer fabrication factory) will also include certain marks on the wafers. These marks may correspond to lot or batch numbers by way of which the starting material was fabricated, for example a number corresponding to the pulled crystal ingot of semiconductor from which the particular wafer was sawn. As in the case of the lot identifiers in the wafer fabrication factory, starting material wafer manufacturers typically laser mark the surface of each wafer, after sawing and polishing.

As noted above, the laser marking of wafers with identifiers, whether carried out by the wafer fabrication factory or by the manufacturer of the starting material wafers themselves, is conventionally made at the front surface of the wafer (i.e., the surface at which the integrated circuits are to be formed), near an edge so as not to disrupt the formation of integrated circuits thereat. However, the front surface marking of wafers presents numerous problems in the manufacture of integrated circuits.

A first problem with conventional front-surface wafer marking is the lack of visibility of the marking as the wafer is processed to form integrated circuits. The formation of opaque layers, such as metallization, over the wafer identifiers of course obscures the identifiers, except for any topology presented by the identifiers. However, many modern integrated circuit fabrication processes now include planarization of deposited insulator layers prior to the deposition of metallization, in which case even the remaining topology presented by the wafer identifiers is eliminated.

Another readability problem encountered with conventional wafer identifier marking is due to physical boundaries that overlie the marking. For example, many modem wafer fabrication processes utilize a technique referred to as "edge exclusion" to remove excess photoresist that gathers, in the form of a berm, at the perimeter of the wafer because of surface tension effects. Edge exclusion is typically carried out by exposure of the photoresist berms at the wafer edges to light (for positive photoresist) and then dissolution of the exposed photoresist by a solvent. However, if the boundary of the edge exclusion passes over the wafer marking, the readability of the identifier may be significantly reduced by the contrast in structure between the portion in the edge exclusion region and that over which photoresist remains.

Because of these and other limitations, the backside marking of wafers has been considered. However, topology presented by the backside mark has been observed to reduce the ability of vacuum chucks to securely hold the wafer during processing, thus presenting a risk of yield loss. Also, the topology presented by the backside marking has been observed to cause defocus in photolithography. Additionally, integrated circuit wafers are generally thinned by a backgrinding process prior to electrical testing; such backgrinding will, of course, eliminate the wafer identifier.

The reading of conventional wafer marking from either the front or back surfaces, also involves additional wafer movement during wafer fabrication. As is well known in the art, wafers are transported in the wafer fabrication factory by way of multiple-wafer carriers. During such time as wafers are retained within the carrier, frontside or backside wafer markings are not directly visible. The wafers must therefore be translated to be at least partially removed from the carrier in order for human or machine reading of the wafer marking; such translation is of course time consuming in the wafer fabrication factory, involves additional equipment or human intervention, and heightens the risk of wafer damage during manufacture.

By way of further background, special equipment for viewing the surfaces of wafers when in carriers is known, such equipment involving the insertion of mirrors into the space between the wafers in the carrier.

By way of further background, starting material wafer manufacturers also generally construct their wafers to indicate their crystalline orientation, dopant type (p or n), and to provide a registration mark. These indicators are generally in the form of a shaping to the wafer. A common example of such an indicator is the so-called "flat" of the wafer, which is a flat edge formed along a chord of the otherwise circular wafer. In recent years, notches have been formed in the edge of the wafer to provide a registration mark for later processing. Such construction for purposes of orientation and registration have not only been observed to reduce the available wafer surface (in the case of the flats), but also add cost to the manufacture of the starting material. Additionally, the edges and corners presented by flats and notches have been observed to be the source of particulate contamination.

BRIEF SUMMARY OF THE INVENTION

It is therefore an object of the present invention to provide a technique of wafer marking that maintains its readability through wafer fabrication processing.

It is a further object of the present invention to provide such a wafer marking technique that permits in situ identification of the wafer during fabrication processing.

It is a further object of the present invention to provide such a wafer marking technique that can be used to orient the wafer for fabrication processing.

It is a further object of the present invention to provide wafer identifiers that can be read while the wafer is in a carrier.

Other objects and advantages of the present invention will be apparent to those of ordinary skill in the art having reference to the following specification together with its drawings.

The present invention may be implemented by the placement of marking along the edges of semiconductor wafers, prior to the fabrication of integrated circuits thereupon. Preferably, the marking is made according to a two-dimensional, or matrix, machine readable bar code system, where the marks are made in the lower half of the wafer edge, or on an edge bevel. The wafer identifiers may include lot number, wafer number, starting material lot number, substrate doping type, and crystal orientation, as desired.

According to another aspect of the present invention, the wafer marks are placed along the wafer edge at specified angular positions, so that the wafer edge marks may be used for orientation of the wafer. The orientation markings may be used in combination with a wafer rotation apparatus that can rotate each wafer while in the wafer carrier, with the wafer identifier used as feedback control for the rotator.

According to another aspect of the present invention, wafer identifier reading systems are provided either in stand-alone form or within a processing system, to permit the in situ reading of the wafer identifiers during processing.

BRIEF DESCRIPTION OF THE SEVERAL VIEWS OF THE DRAWING

FIG. 5 is a schematic diagram of a processing system utilizing wafer edge marking according to the preferred embodiments of the invention.

DETAILED DESCRIPTION OF THE INVENTION

Figure 1:
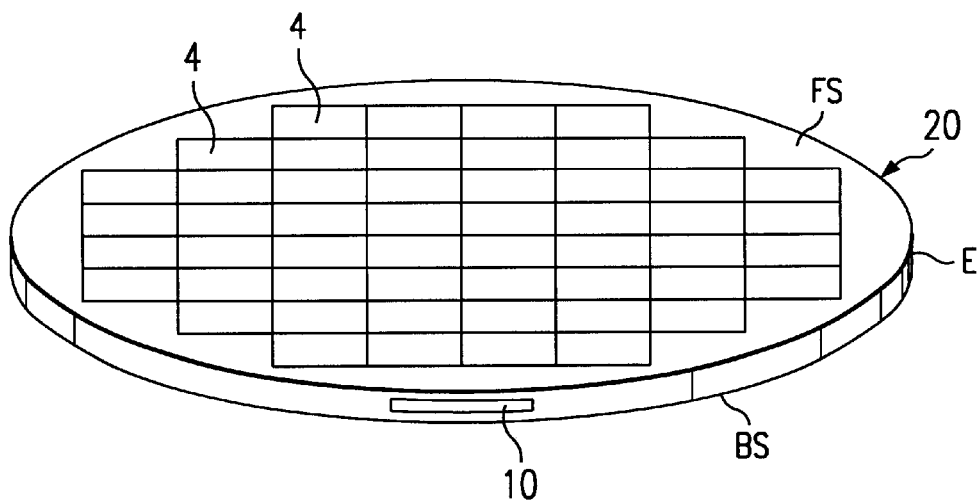
FIG. 1 is a perspective view of a wafer illustrating the location of wafer edge marking according to the preferred embodiments of the present invention.

As will become apparent to those skilled in the art having reference to the following description, the present invention may be utilized in connection with a wide range of embodiments, and in numerous ways in connection with the manufacture and analysis of integrated circuits. Accordingly, the following description is presented by way of example only, it being understood that other alternative embodiments and beneficial uses are contemplated to be within the scope of the present invention as hereinafter claimed. In the following description, like reference numerals will be used among the various embodiments of the invention to refer to common elements thereto.

Referring first to FIG. 1, wafer 20 according to the preferred embodiments of the present invention is illustrated. Wafer 20 is a semiconductor wafer of a conventional material as used in the art, such as single-crystal silicon (which may have an epitaxial active layer thereupon), gallium arsenide or another III–V semiconductor, germanium, and the like.

As shown in FIG. 1, wafer 20 has front surface FS at which partially fabricated integrated circuits 4 are disposed. As shown in FIG. 1, integrated circuits 4 are arranged in an array of rows and columns upon front surface FS, in the conventional manner. Wafer 20 also has back surface BS, at which no active components are formed; as is conventional in the art, back surface BS is preferably a smooth surface to permit the securing of wafer 20 by vacuum chucks within processing equipment. According to the preferred embodiments of the invention, front surface FS (and, of course, back surface BS) are substantially circular.

Wafer edge E corresponds to the peripheral edge of wafer 20, having a length equal to the perimeter of wafer 20 and a width equal to the thickness thereof. According to the preferred embodiments of the invention, wafer marking 10 is provided along wafer edge E. While one location of wafer marking 10 is illustrated in FIG. 1, it is contemplated that multiple locations of wafer marking 10 may be provided around the perimeter of wafer 20, depending upon the extent of information to be so marked, the number of times (or sites) in the manufacture of wafer 20 at which such marking is carried out, and the like. Wafer marking 10, as will become more apparent from the following description, includes numerous identifiers regarding the manufacturing history of wafer 20.

Figure 2:
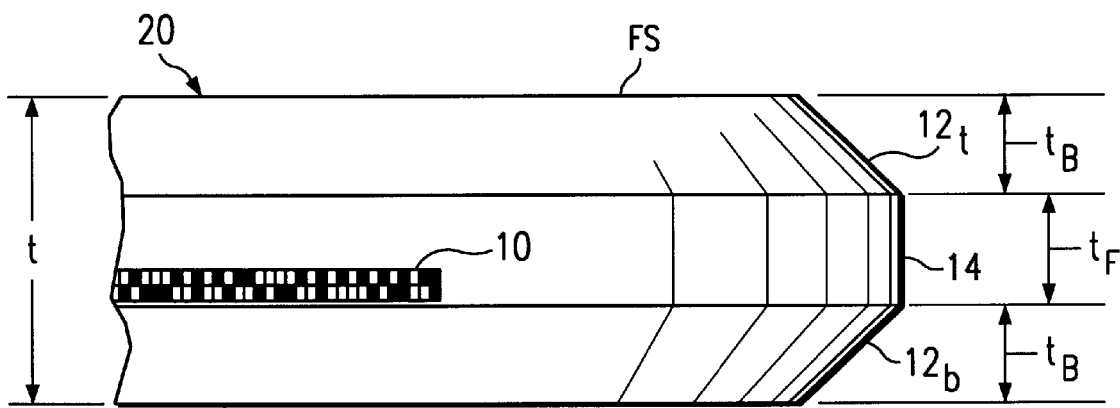
FIG. 2 is an elevation view of the wafer of FIG. 1 according to the preferred embodiments of the invention.

FIG. 2 illustrates the position of wafer marking 10 along wafer edge E of wafer 20 in further detail. As illustrated in FIG. 2, wafer 20 is of a thickness t. For example, thickness t is on the order of 725$\mu$ for wafer 20 of a 200 mm diameter; thickness t is on the order of 775$\mu$ for a 300 mm diameter wafer 20, and on the order of 825$\mu$ for a 450 mm diameter wafer 20. Wafer 20 preferably has bevels 12$_t$, 12$_b$ at the top and bottom of wafer edge E, respectively, for purposes of reducing wafer damage and the corresponding generation of particulates, as known in the art. In the example of a 200 mm diameter wafer 20, the thickness t$_b$ of bevels 12 is on the order of 240$\mu$, leaving flat portion 14 of edge E having a thickness t$_f$ of also on the order of 240$\mu$.

According to one exemplary implementation of the present invention, wafer marking 10 is preferably located along edge E nearer to back surface BS than to front surface FS. As shown in FIG. 2, wafer marking 10 is located in the lower half of flat portion 14, but of course above bevel 12$_b$ along the bottom of wafer edge E. This location of wafer marking 10 is preferred so that the identifiers presented thereby are not obscured by edge effects such as sputtered metal film, photoresist berm removal by edge exclusion, and the like. As such, the height of wafer marking 10 is preferably limited to about 120$\mu$, but may of course be quite wide, given the large circumference of wafer 20 relative to the thickness of edge E.

Alternatively (or in addition), wafer 20 may be marked within top bevel 12$_t$ nearer front surface FS. Bevel 12$_t$ provides a wider region within which to effect laser marking, given the geometry of wafer 20 of this embodiment of the invention; additionally, any laser marking on top bevel 12$_t$ will remain in place after wafer 20 is subjected to backgrinding, thus providing positive lot and wafer identification for wafer at the time of electrical test, and until wafer 20 is diced for assembly and packaging of integrated circuits 4. As noted above, however, the readability of wafer marking 10 long top bevel 12$_t$ may be reduced by the deposition of material thereupon during wafer fabrication, and also by the effects of edge exclusion and other cleanup processes.

Still further in the alternative, or in addition to marking on flat portion 14 (or top bevel 12$_t$), wafer 20 may be marked at one or more locations along bottom bevel 12$_b$. Bottom bevel 12$_b$ will generally be less exposed to processing carried out at front surface FS, and as such wafer marking 10 in place along bottom bevel 12$_b$ will be less subject to interference from film deposition processes, photoresist removal operations, and the like.

According to the preferred embodiments of the invention, wafer marking 10 is formed by way of laser marking, where a laser beam irradiates selected locations of edge E to locally melt spots therealong; upon recrystallization of these localized melt regions, permanent marks remain, due to differences in crystal structure, density, and the like that are caused by the local melting and recrystallization. Such marking may be carried out by conventional laser wafer marking systems. In this regard, it is preferred that the laser power used in effecting the marking not be so high as to ablate wafer 20 and form grooves in edge E.

A typical laser spot size for conventional laser-based wafer marking equipment is on the order of 50$\mu$. As noted above, the lower half of flat portion 14 of wafer edge E is only slightly more than twice this spot size. It is therefore desirable to mark wafer 20 not with alphanumeric numbers per se, but rather with an encoded form of the wafer and lot identification information. Such coded information not only fits within the relatively narrow region provided by beveled wafer edge E, but also facilitates machine-readability of the information.

FIG. 2 illustrates a simple example of the marking provided according to the preferred embodiments of the invention. As shown in FIG. 2, wafer marking 10 is preferably realized in the form of a two-dimensional bar code. Such two-dimensional codes are commonly referred to as "2-D" bar codes, either as a stack of linear ("1-D") code, read by repetitive scanning of a linear bar code reader, or as a full two-dimensional or matrix code, requiring a two-dimensional reader. Examples of suitable 2-D codes are well known in the symbology art, and include PDF417, SuperCode, Code One, and the like; of course, a dedicated code useful within a particular laser fabrication factory may alternatively be used. The particular code arrangement will depend upon individual applications. In any case, the code is presented in binary fashion, with the irradiated and non-irradiated spots along wafer edge E corresponding to binary values. Conventional features, such as start, finder, or orientation structures, are provided within wafer marking 10, for registration of the reader.

According to the preferred embodiment of the invention, various types and quantities of information may be encoded within one or more laser markings 10 for a given wafer. The particular arrangement of this information within the one or more laser markings 10 is not particularly important, so long as the position of any machine readable data is consistent for purposes of programming reading and decoding equipment. Indeed, wafer 20 may be marked, within one or more laser markings 10 at its edge E, by multiple sources, at multiple stages in the process and, if necessary, using multiple coding schemes. By way of example, the following information may be encoded by either the manufacturer of wafer 20 as starting material or by the manufacturer of integrated circuits 4 upon wafer 20, as the case may be:

Lot number assigned during starting material manufacture
Starting material dopant type (p-type or n-type)
Crystal orientation (e.g., <111>)
Quality grade (e.g., polishing specification)

Also by way of example, the following information may be encoded in the wafer fabrication factory, by the manufacturer of integrated circuits 4 upon wafer 20:

Wafer fabrication lot number
Wafer number (within the lot)
Device type (of integrated circuits 4 being formed thereupon)
Wafer fabrication factory identifier These types of information are not presented herein as an exhaustive list, as it is contemplated that those skilled in the art having reference to this specification will utilize the present invention in marking the wafers with such other information as can be utilized in the manufacture of integrated circuits and yield analysis in such manufacture.

As noted above, the provision of wafer marking 10 along edge E of wafer 20 according to the preferred embodiments of the invention provides numerous important benefits in wafer fabrication. Firstly, such wafer marking remains fully visible and readable throughout the wafer fabrication process, without being vulnerable to partial or total coverage by subsequently deposited layers or by cleanup processing such as edge exclusion of photoresist. Secondly, the laser marking according to the preferred embodiments of the invention also does not affect the ability of vacuum chucks or other wafer handling equipment, as would backside marking of the wafer, while remaining visible and readable throughout the entire process, even after backgrind (particularly if located along an upper bevel of the wafer edge, as noted above).

According to a first preferred embodiment of the invention, wafer marking 10 is provided along edge E of wafer 20, at one or more perimeter locations that may be selected effectively at random, with no significance accorded to the particular perimeter location at which such marking 10 resides. According to this first preferred embodiment of the invention, the entirety of the information conveyed by wafer marking 10 is encoded within the marking itself.

According to a second preferred embodiment of the invention, the laser marking along the edge is also placed to convey the additional information of the orientation of the integrated circuits being formed upon the wafer surface. In this regard, attention is now directed to FIG. 3 in connection with the following description of this second preferred embodiment of the present invention.

Figure 3:
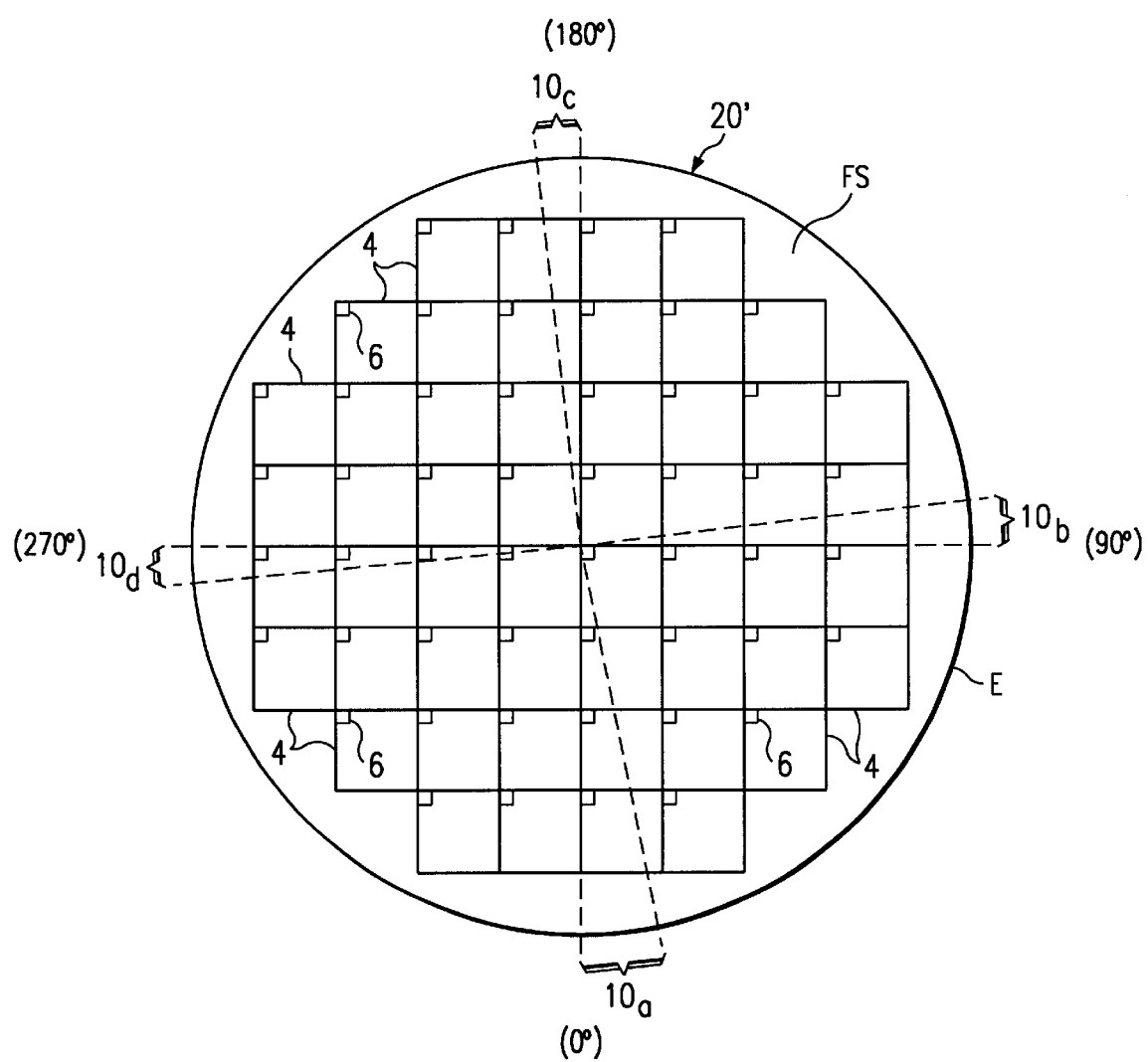
FIG. 3 is a plan view of a wafer marked according to a second preferred embodiment of the invention.

FIG. 3 illustrates wafer 20' according to this second preferred embodiment of the present invention, in plan view looking down at front surface FS thereof. As shown in FIG. 3, partially fabricated integrated circuits 4 are arranged in an array on front surface FS. In this example, integrated circuits 4 do not extend fully to edge E of wafer 20 (and as such, no "partial" die are formed); alternatively, partial die may be in place at edge E of wafer 20', in the known manner. Each integrated circuit 4 in the array on front surface FS is oriented identically, as evident from the common location of feature 6 within each integrated circuit 4 of wafer 20'.

According to this second preferred embodiment of the invention, the position of wafer markings 10 correspond to the orientation of integrated circuits 4 on wafer 20'. In the example of FIG. 3, wafer marking 10a is provided at a fixed location along edge E of wafer 20' relative to the orientation of integrated circuits 4 thereupon. Wafer marking 10a includes the appropriate wafer identification information discussed hereinabove, including wafer fabrication factory lot and wafer number, as well as such other information as is desired for purposes of yield analysis and wafer tracking. Wafer marking 10a may be along the flat portion 14 of edge E, or along top bevel $12_t$ or bottom bevel $12_b$, as desired.

According to this embodiment of the invention, wafer marking 10a is located at the same location of edge E, relative to the orientation of integrated circuits 4, on each of wafers 20 processed by the wafer fabrication factory, at least on each of the wafers 20' corresponding to the same integrated circuit device type (i.e., having common photomasks). This orientation of wafer marking 10a is preferably effected by way of conventional x-ray diffraction analysis. In this regard, wafer marking 10a is made prior to the formation of any portion of integrated circuits 4 (or at least prior to the first photolithography operation). The first photolithographic operation then uses wafer marking 10a as a registration mark, thus orienting integrated circuits 4 relative to wafer marking 10a. Subsequent photolithographic operations may then be performed with at least coarse registration to wafer marking 10a, considering that typical laser spot sizes are on the order of 50µ and thus of suitable accuracy for effecting at least coarse registration; fine alignment of levels may then be made relative to previously patterned features on integrated circuits 4, in the usual manner.

In this manner, wafer marking 10a according to this second preferred embodiment of the present invention not only provides wafer identification information, but also indicates the orientation and position of integrated circuits 4 on the surface of wafer 20'. As such, physical features into wafer 20' itself, such features including flats or notches, are not necessary, thus reducing the cost of manufacturing of wafer 20' itself, and also eliminating the risks of wafer damage in producing such features, and of particulate contamination resulting from sharp edges of wafer 20'. Additionally, by eliminating the need for orientation notches and flats, equipment for performing processes that are themselves independent of wafer orientation, such as plasma etch, will no longer need the capability to orient wafers in order to account for the presence of orientation notches and flats, thus reducing equipment cost in the wafer fabrication factory.

As discussed above, a single wafer marking 10a is sufficient to provide orientation of wafer 20'. According to this second preferred embodiment of the invention, however, multiple laser markings 10 may be provided at fixed azimuths relative to integrated circuits 4 on front surface FS, to assist in the rotation and orientation of wafer 20 in automated equipment. As will be described in further detail hereinbelow, laser markings 10 may be used by automated equipment to rotate and orient wafer 20' in an automated manner. In this regard, it is contemplated that multiple laser markings 10 may provide assistance in this rotation and orientation of wafer 20 by providing an indication of the approximate current orientation of wafer 20'.

For example, with reference to FIG. 3, wafer 20' includes auxiliary laser markings 10b, 10c, 10d, at relative azimuths of 90°, 180°, 270°, respectively, relative to wafer marking 10a. These auxiliary laser markings 10b, 10c, 10d need not include any encoded wafer identification information in the case where such information is fully provided within wafer marking 10a; alternatively, the wafer identification information may be spread out among laser markings 10a through 10d, or redundantly provided within some or all of laser markings 10a through 10d, as desired. In any case, according to this preferred embodiment of the invention, laser markings 10a through 10d include at least a portion that uniquely identifies the azimuth thereof, so that automated decoding machines can determine the current azimuthal orientation of wafer 20' by scanning laser markings 10a through 10d. For example, if wafer 20' is oriented 90° from a desired position, a scanning machine can determine this Disorientation by reading wafer marking 10b rather than wafer marking 10a, in which case rotational equipment can be instructed to rotate wafer 20' counterclockwise by 90°, and into the desired orientation. This scanning may occur while wafer 20' is being slowly rotated past the scanner, or by way of trial and error. Alternatively, scanning equipment may be able to accurately determine, by triangulation, the current orientation of wafer 20' using wide angle equipment that can view two laser markings 10 at once. These and other alternative uses of multiple laser markings 10 at fixed azimuths relative to integrated circuits 4 are contemplated to be apparent to those skilled in the art having reference to this specification.

According to this second preferred embodiment of the invention, therefore, wafer orientation information is provided by wafer edge markings. This orientation information is contemplated to be particularly useful in at least coarsely orienting wafers within a carrier, or at single-wafer processing stations such as photolithographic steppers and the like. The presence of this orientation information along the edge of the wafer also enables processing equipment to use feedback to rotate the wafers into the proper orientation in situ.

Figure 4:
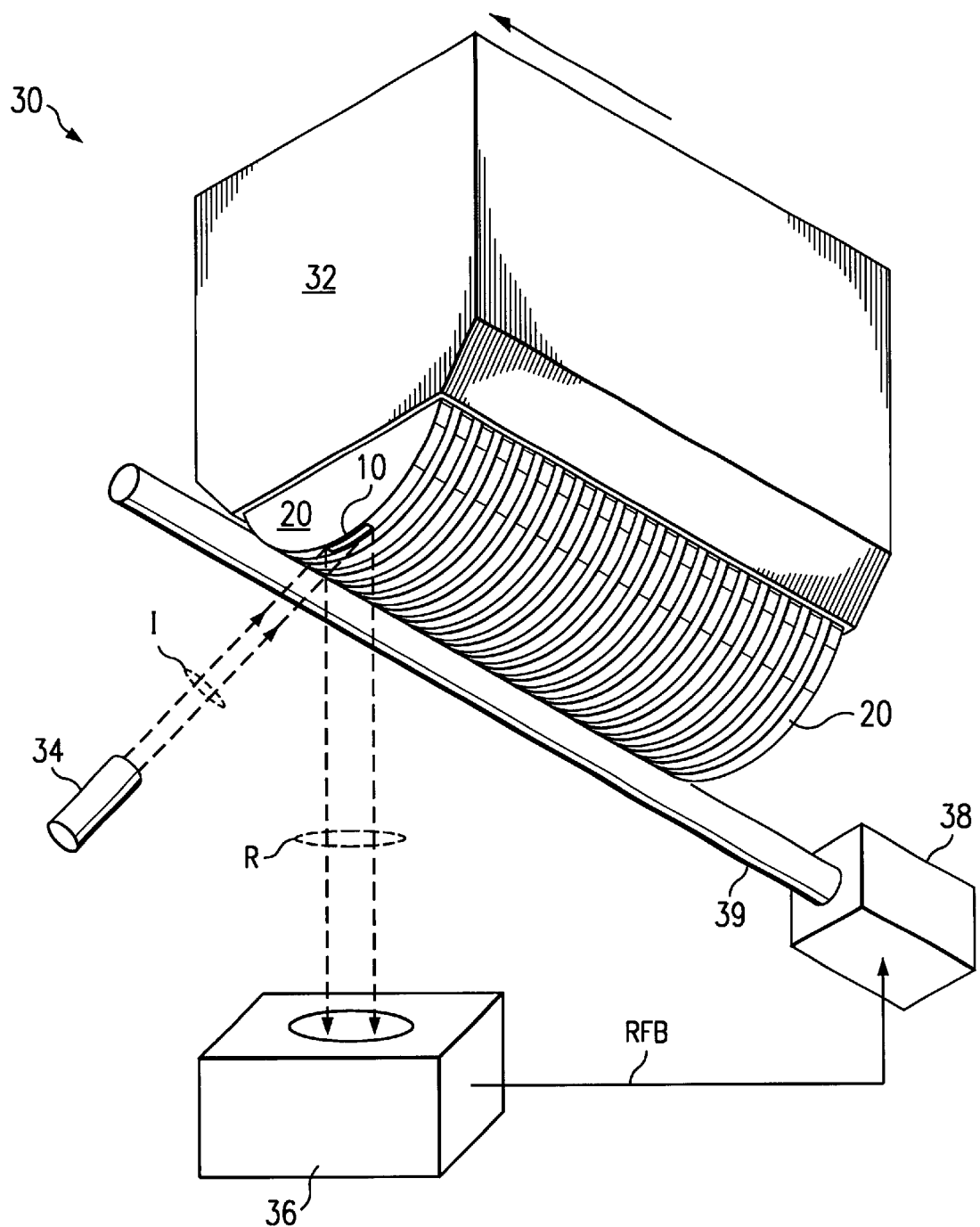
FIG. 4 is a perspective view of a system for reading wafer edge marking according to the preferred embodiments of the invention.

Referring now to FIG. 4, system 30 for reading wafer edge markings according to the preferred embodiments of the invention will now be described. System 30 is shown in substantially a schematic form in FIG. 4, by way of its primary functional components; the physical and structural arrangement and implementation of these functional features within manufacturing equipment is contemplated to be well within the capability of those skilled in the art.

As shown in FIG. 4, carrier 32 is provided to hold a batch, or lot, of wafers 20 therewithin. As is conventional in the art, wafers 20, constructed according to the preferred embodiments of the invention as described above, are held by carrier 32 in a parallel arrangement, vertically oriented in this example. According to this embodiment of the invention, however, carrier 32 is constructed to have a large opening at its bottom, to permit wafers 20 to protrude therefrom to a sufficient extent that laser markings 10 may be viewed therefrom. Because of this protrusion, provision should be provided for the transport of carrier 32 within another apparatus (not shown) so that carrier 32 need not rest on its bottom surface, given the protrusion of wafers 20 therefrom.

Alternatively, carrier 32 may be constructed simply to have an opening at the bottom through which edges E of wafers 20 disposed therein are simply visible. In this case, carrier 32 may be self-supporting, having legs or supports extending beyond the diameter of wafers 20 therewithin.

System 30 in this embodiment of the invention provides for machine reading of wafer marking 10 on each wafer 20, as will now be described. Light source 34 is provided in proximity to the underside of wafers 20, to illuminate edge E of one or more wafers 20 with incident light I. Incident light I will reflect from wafers 20, in a direction (shown in FIG. 4 by reflected light R) toward sensor 36. Sensor 36 is a conventional image recognition system for sensing variations in the reflections of light presented by the coding within wafer marking 10 along edge E of the illuminated one of wafers 20 within carrier 32. Examples of sensor 36 include a bar code reader and decoder, a camera, a camera in combination with an image processing and recognition system, and the like. Sensor 36 itself also preferably decodes and interprets the information contained within wafer marking 10, whether as alphanumeric characters or in the form of a bar code. Sensor 36 then preferably communicates the detected information to the appropriate manufacturing information system (not shown) or to a human operator by way of a visual display (not shown).

As is evident to those in the art, wafers 20 can often be oriented somewhat randomly within carrier 32. As such, the desired wafer marking 10 will generally not be viewable from the bottom of carrier 32, as shown in FIG. 4. According to this embodiment of the invention, system 30 includes motor 38 and roller 39 for orienting wafers 20 within carrier 32. As shown in FIG. 4, roller 39 in this example is a bar that is in contact with the protruding portion of wafers 20, at a location away from that illuminated by light source 34 so as not to interfere with the reading of wafer marking 10 by sensor 36. Roller 39 is rotatable about its longitudinal axis by motor 38; the rotation of roller 39 will thus also rotate wafers 20 with which it is in contact.

Accordingly, in operation, motor 38 operates to rotate roller 39, and thus rotate the currently illuminated wafer 20 into a position that permits wafer marking 10 to be visible to sensor 36. As shown in FIG. 4, rotational feedback signal RFB is generated by sensor 36 to motor 38, so that the rotation of roller 39 may be initiated when wafer marking 10 is not visible to sensor 36, and stopped when wafer marking 10 is in a readable position. Once a wafer 20 is identified by sensor 36 and its information read, carrier 32 may then be linearly translated relative to sensor 36 (preferably by moving carrier 32 in an indexed manner) to place a next wafer 20 in position to be illuminated by light source 34 and read by sensor 36, after rotation by roller 39 to place its wafer marking 10 into a readable position. This procedure is repeated until all of the wafers 20 in carrier 32 are identified by sensor 36. Alternatively, multiple sensors 36 (e.g., cameras, or CCD imagers) may be provided near carrier 32, so that some or all of wafers 20 within carrier 32 may be identified simultaneously, without translation of carrier 32. Further in the alternative, wafers 20 may be withdrawn from carrier 32 for single-wafer processing after identification by sensor 36, with the next wafer 20 in carrier 32 then identified prior to its processing.

As noted above, system 30 is suitable for use with edge-marked wafers 20, 20' according to any of the preferred embodiments of the present invention. In the case where carrier 32 contains wafers 20' having the multiple wafer markings 10a through 10d discussed above relative to FIG. 3, motor 38 may also be controlled by sensor 36 to more efficiently rotate roller 39. In the example where wafer marking 10a contains the identification information and wafer markings 10b through 10d indicate their respective azimuthal position relative to wafer marking 10a, roller 39 may rotate the currently-illuminated wafer 20 into position for any one of wafer markings 10a through 10d to be read by sensor 36. Upon sensor 36 reading one of the azimuthal indications of markings 10b through 10d, sensor 36 can then generate an appropriate rotational feedback RFB to cause motor 38 to rotate roller 39 and wafer 20 into the proper position. Such operation will generally be more efficient than a scan of the entire wafer perimeter, as only a reduced portion of edge E need be scanned in order to identify the wafer orientation.

It may, in some process situations, be useful to have all of wafers 20 within carrier 32 at a common rotational orientation. Further in the alternative therefore, independently-driven rollers 40 may be provided in system 30, one for each of wafers 20 within carrier 32, so that each wafer 20 may be independently rotated so as to be the desired position. In this alternative implementation, multiple sensors 36 may be provided, one for each wafer position of carrier 32, so that the independent rotation may be controlled and wafer identification read simultaneously; alternatively, sensor 36 (and light source 34, if necessary) may simply be stepped along carrier 32 to sequentially control the orientation of the independently rotated wafers 20, and read the identification information in the corresponding wafer marking 10.

In addition to rotation of wafers 20' for identification purposes, it is contemplated that wafers 20' having orientation information in their laser markings 10 may also be used for purposes of detecting orientation dependence upon processing. For example, it may be desirable to orient the various wafers 20' in specified, but varying, orientations for different processes. System 30 may, in such a case, identify each wafer 20' and place it in a specific orientation (e.g., 90° rotated relative to its neighbors), prior to a batch process; this orientation would be stored in a factory computer, for use in subsequent yield analysis. Upon completion of manufacturing and test, analysis may then be carried out to determine if an orientation dependence is present in a specific process.

FIG. 5 illustrates another alternative implementation of the present invention, which is particularly well-suited for in situ wafer orientation and identification within single-wafer processing equipment. Processing system 40 of FIG. 5 is a single-wafer processing station, for performing a fabrication process upon wafer 20 during its manufacture. The process performable by processing system 40 may be any conventional single-wafer process operation in integrated circuit manufacturing, including deposition of a film, an etch process (plasma etch or wet etch), photolithographic exposure such as may be performed by a stepper, a chemical bath cleanup, a thermal process such as a rapid thermal anneal (RTA), or an electrical or physical measurement made at a selected point along the manufacture of the integrated circuits on wafer 20. In this regard, processing system 40 includes chamber 42, within which chuck 41 is disposed for holding wafer 20. In this example, chuck 41 is supported by rotatable shaft 47 that is turnable by motor 48. In the conventional manner, chamber 42 maintains the appropriate ambient environment, including atmosphere (air, or inert gas, or reactive gas), pressure, and temperature as appropriate for the corresponding process. Chuck 41 is preferably a vacuum chuck for securely holding wafer 20 during processing within chamber 42.

Processing mechanism 44 of FIG. 5 refers to the particular processing functions and equipment for effecting the process performed by processing system 40. For example, where processing system 40 is for performing photolithographic exposure, processing mechanism 44 would be the stepper apparatus (including such components as the exposure light source, the photomask or reticle, and the apparatus for properly focusing and registering the exposure upon wafer 20); alternatively, in the example where processing system 40 is for performing a chemical vapor deposition, processing mechanism 44 would include the appropriate functions for establishing the proper ambient pressure and chemical composition of the atmosphere within chamber 42. As processing system 40 according to this embodiment of the invention may be used in connection with any one of a number of processes, it is therefore contemplated that the generic illustration of processing mechanism 44, and its generic description as the mechanism for accomplishing the process, are sufficient to provide those skilled in the art with a clear description of this embodiment of the invention.

Processing mechanism 44, in this embodiment of the invention, is under the control of process control computer 46. Process control computer 46 has sufficient processing capability to control the operation of processing mechanism 44 in order to execute the manufacturing process called for in the manufacturing process flow. Furthermore, as suggested in FIG. 5, process control computer 46 may also be in communication with a larger scale factory computer; such a factory computer is often provided in modern wafer fabrication factories for tracking the progress of wafers and lots, for monitoring various process parameters, and for maintaining a database of the process parameters under which each identified wafer 20 is processed.

According to this embodiment of the invention, processing system 40 has the capability of reading wafer marking 10 along edge E of wafer 20 when in place upon chuck 41. For example, as shown in FIG. 5, system 40 includes light source 34 for illuminating a portion of edge E of wafer 20 (with incident light I shown in FIG. 5); reflected light R from edge E of wafer 20 is received by sensor 36, which is disposed in one of the walls of chamber 42, for example. As described above, sensor 36 is able to sense variations in the reflections of light that are presented by the coding within wafer marking 10, whether as alphanumeric characters or in the form of a bar code, and to decode the information corresponding thereto. Sensor 36 provides output signals ID corresponding to the detected information to process control computer 46, and rotational feedback RFB to motor 48. Similarly as discussed above relative to system 30 of FIG. 4, rotational feedback signal RFB can control motor 48 to rotate shaft 47, and in turn chuck 41 and wafer 20, until wafer marking 10 is readable by sensor 36. Alternatively, if multiple wafer markings 10, including azimuthal orientation are provided as in the case of wafer 20' described above relative to FIG. 3, rotational control of chuck 41 may be effected in response to orientation information provided by wafer markings 10*b* through 10*d* (which are at indicated azimuths relative to information-bearing wafer marking 10*a*), to rapidly and efficiently rotate wafer 20' to the desired position.

Upon wafer marking 10 being positioned by motor 48 into the readable position, sensor 36 can then sense the information contained within wafer marking 10, and decode this information to the extent of its capability. This information is then communicated to process control computer 46 by sensor 36 via signals ID. Process control computer 46 is then able to log and utilize this information to the extent desired, as will now be described relative to a number of examples.

In this regard, process control computer 46 can log the lot and wafer number contained within wafer marking 10 of wafer 20 for correlation with the parameters of the processing to be carried out by system 40, and communicate this information to the factory computer for later yield analysis. Furthermore, this embodiment of the invention enables process control computer 46 to set or verify the process parameters to be used by processing mechanism 44 in response to the identification information read by sensor 36. For example, where the processing parameters of system 40 vary by device type and where the device type is indicated by wafer marking 10, process control computer 46 can communicate the appropriate process parameters for the indicated device type to processing mechanism 44 in response to the device type signals ID communicated by sensor 36. Alternatively, the wafer fabrication factory computer may maintain a database indicating the integrated circuit device type to be fabricated upon each wafer, and can communicate this information to process control computer 46 in system 40; upon receipt of the lot and wafer identification of wafer 20 from sensor 36, process control computer 46 can then determine the device type of the integrated circuits to be formed thereupon, and communicate the appropriate processing parameters to processing mechanism 44. Still further in the alternative, it is contemplated that the factory computer may store the processing parameters for previous processing operations that have been carried out upon wafer 20 currently in chamber 42; these processing parameters, or compensating adjustments to the process to be carried upon this wafer 20 by system 40, may be fed forward to process control computer 46. Upon the identification of wafer 20 read by sensor 36 and communicated to process control computer 46 matching such fed-forward information, process control computer 46 can then adjust the process parameters as indicated by the factory computer. In this manner; it is contemplated that downstream processes may be optimized, on an individual wafer basis, according to the present invention, such wafer-by-wafer compensation being enabled by the ability to positively identify each wafer 20 within process chamber 42.

Further in the alternative, it is contemplated that wafer marking 10 may be used to at least coarsely orient wafer 20 within process chamber 42 for processes, such as photolithography, that are sensitive to the azimuthal wafer orientation. For example, whether by way of a single wafer marking 10 or by way of multiple wafer markings 10*a* through 10*d* that indicate azimuthal orientation, both approaches described hereinabove, sensor 36 may control motor 48 by way of rotational feedback signal RFB to rotate chuck 41 and wafer 20 into the position desired for processing. Considering the precision with which laser spots may be made as discussed above, as well as the precision of modern motors such as motor 48, it is contemplated that laser markings 10 according to the present invention may be used to rotationally align wafer 20 within processing system 40. Such rotational alignment is contemplated to at least coarsely align wafer 20, with the fine alignment required by photolithography carried out by conventional techniques in system 40. Alternatively, as noted above, a specified orientation of wafer 20 may be specified, and logged, for the process carried out in system 42; subsequent yield analysis may then determine whether the orientation of wafer 20 in this process has an effect upon manufacturing yield or electrical performance.

Still further in the alternative, it is contemplated that processing system 40 may be constructed to perform batch processing upon a lot of wafers 20, rather than a single wafer process. In this alternative implementation, processing system 40 may operate to read, rotate, and align wafers 20 within a carrier, such as described above relative to FIG. 4, using one or more sensors 36 as described above.

It is contemplated that these, and other, applications of the present invention will be apparent to those skilled in the art having reference to this specification. In general, it is contemplated that the ability to positively identify (and, optionally, rotationally orient) a specific wafer within processing equipment enables a great deal of in situ process control on a wafer-by-wafer basis in the wafer fabrication facility.

The present invention therefore provides numerous benefits in the manufacture of integrated circuits. These advantages include the ability to provide wafer and lot identification of each wafer in a robust manner, not obscured by wafer processing operations or by backgrind, and in a manner that does not occupy chip area that could be devoted to active integrated circuits, and does not affect the operability of vacuum chucks and other wafer retention equipment. Furthermore, the ability to mark the wafers along the edge, and thus in an area that has a large available length, enables the ability to mark the wafer with additional identification information, including device type, starting material lot number, material specifications, and the like. Furthermore, wafer edge marking according to the present invention can include orientation information relative to the integrated circuits being formed thereupon, to assist in the efficient reading of the marked information, and also in the rotational orientation of the wafer during processing.

Furthermore, the present invention facilitates the use of in situ wafer identification. In the context of wafer carriers, the edge marking according to the present invention enables the wafers to be identified within the carrier, without requiring wafers to be removed therefrom. Additionally, the wafer edge marking according to the present invention also permits the identification of wafers within processing equipment, for correlation with the parameters of the processing of the wafer as useful for yield analysis, and also for use in control of the processes themselves.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:
1. A semiconductor wafer, comprising:
 a. a front surface and a back surface;
 b. a side surface being substantially perpendicular to the front and the back surfaces, the width of the side surface being at least about one-third the distance between the front surface and the back surface, and the side surface being centrally located between the front and the back surfaces, around the perimeter of the wafer; and
 c. encoded information inscribed at least at one location on the side surface.

2. The wafer of claim 1, further comprising two beveled surfaces, a top beveled surface between the front surface and the side surface, and a bottom beveled surface between the side surface and the back surface.

3. The wafer of claim 1, wherein integrated circuits are disposed upon the front surface, the integrated circuits being at least partially fabricated.

4. The wafer of claim 1, wherein the inscription at one or more locations on the side surface is nearer the back surface than the front surface.

5. The wafer of claim 1, wherein the inscription at one or more locations on the side surface is nearer the front surface than the back surface.

6. The wafer of claim 1, wherein the inscription on the side surface is in the form of alphanumeric characters.

7. The wafer of claim 1, wherein the inscription on the side surface is encoded in the form of a barcode.

8. The wafer of claim 7, wherein the barcode inscription on the side surface is one-dimensional.

9. The wafer of claim 7, wherein the barcode inscription on the side surface is two-dimensional.

10. The wafer of claim 1, wherein the information includes information regarding the composition of the wafer.

11. The wafer of claim 1, wherein the location of the inscription on the side surface is indicative of the crystal orientation of the wafer.

12. The wafer of claim 1, wherein the location of the inscription on the side surface is indicative of the orientation of the integrated circuits disposed upon the front surface.

13. The wafer of claim 1, wherein the inscription is at a plurality of locations along the edge.

14. The wafer of claim 1, wherein the inscription includes information regarding the identity of the wafer.

15. The wafer of claim 1, wherein the inscription includes information regarding the identity of a manufacturing lot to which the wafer belongs.

16. The wafer of claim 1, wherein the barcode pattern is formed by re-crystallization of melted silicon spots of about 50 micrometers in size; the melting of silicon being caused by irradiating a laser beam of suitable power at the side surface.

17. A silicon wafer, comprising:
 a. a front surface and a back surface;
 b. a side surface being substantially perpendicular to the front and the back surfaces, the width of the side surface being at least about one-third the distance between the front surface and the back surface, and the side surface being centrally located between the front and the back surfaces, around the perimeter of the wafer;
 c. a top beveled surface between the side surface and the front surface, and a bottom beveled surface between the side surface and the back surface; and d. an encoded barcode pattern inscribed at a location on the side surface, the barcode pattern being formed by re-crystallization of melted silicon spots of about 50 micrometers in size, the melting of silicon being caused by irradiating a laser beam of suitable power at the side surface.

18. The silicon wafer of claim 17, wherein the barcode inscription on the side surface is one-dimensional.

19. The silicon wafer of claim 17, wherein the barcode inscription on the side surface is two-dimensional.

* * * * *